United States Patent
Huang et al.

(10) Patent No.: US 12,074,629 B2
(45) Date of Patent: Aug. 27, 2024

(54) TRANSFORMER-BASED CURRENT-REUSE AMPLIFIER WITH EMBEDDED IQ GENERATION FOR COMPACT IMAGE REJECTION ARCHITECTURE IN MULTI-BAND MILLIMETER-WAVE 5G COMMUNICATION

(71) Applicant: Swiftlink Technologies Inc., Richmond (CA)

(72) Inventors: Min-Yu Huang, Richmond (CA); Thomas Chen, Richmond (CA)

(73) Assignee: SWIFTLINK TECHNOLOGIES INC., Richmond (CA)

( * ) Notice: Subject to any disclaimer, the term of this patent is extended or adjusted under 35 U.S.C. 154(b) by 0 days.

(21) Appl. No.: 18/139,157

(22) Filed: Apr. 25, 2023

(65) Prior Publication Data
US 2023/0336203 A1     Oct. 19, 2023

Related U.S. Application Data

(62) Division of application No. 16/951,330, filed on Nov. 18, 2020, now Pat. No. 11,677,430.

(51) Int. Cl.
*H04B 1/40*        (2015.01)
*H03F 3/45*        (2006.01)
(Continued)

(52) U.S. Cl.
CPC .......... *H04B 1/40* (2013.01); *H03F 3/45179* (2013.01); *H03H 11/32* (2013.01); *H03F 2200/336* (2013.01); *H04W 84/042* (2013.01)

(58) Field of Classification Search
None
See application file for complete search history.

(56) References Cited

U.S. PATENT DOCUMENTS 6,066,991 A     5/2000   Naito et al.
6,362,685 B1 *  3/2002   Vagher .................... H03F 3/602
                                                 330/53

(Continued)

FOREIGN PATENT DOCUMENTS

WO     2019231773 A1    12/2019
WO     2020214733 A1    10/2020

*Primary Examiner* — Thomas J. Hiltunen
(74) *Attorney, Agent, or Firm* — WOMBLE BOND DICKINSON (US) LLP

(57) ABSTRACT

According to one embodiment, a transformer-based in-phase and quadrature (IQ) includes a differential balun having a first inductor and a second inductor. The first inductor has a first input terminal and a first output terminal. The second inductor has a second input terminal and a second output terminal. Additionally, the IQ generator circuit includes a third inductor magnetically coupled with the first inductor. The third inductor has a first isolation terminal and a third output terminal. The IQ generator circuit also includes a fourth inductor magnetically coupled with the second inductor. The fourth inductor has a second isolation terminal and a fourth output terminal. The IQ generator circuit additionally includes a first transistor coupled to the first input terminal of the first inductor. Further, the generator circuit includes a second transistor coupled to the second input terminal of the second inductor. The first transistor, the second transistor, the first inductor, and the second inductor form a part of a differential amplifier.

12 Claims, 15 Drawing Sheets

(51) Int. Cl.
*H03H 11/32* (2006.01)
*H04W 84/04* (2009.01)

(56) References Cited

U.S. PATENT DOCUMENTS

| | | | |
|---|---|---|---|
| 6,472,950 B1 * | 10/2002 | London | H01P 5/12 |
| | | | 333/127 |
| 6,696,885 B2 | 2/2004 | Christensen | |
| 7,053,722 B2 | 5/2006 | Rein et al. | |
| 7,068,104 B2 * | 6/2006 | Burns | H03F 3/45188 |
| | | | 330/253 |
| 7,199,659 B2 * | 4/2007 | Pan | H03F 1/3211 |
| | | | 330/252 |
| 7,358,806 B2 * | 4/2008 | Burns | H03F 3/211 |
| | | | 330/124 R |
| 7,893,782 B2 | 2/2011 | Hosoya et al. | |
| 8,243,855 B2 | 8/2012 | Zarei | |
| 9,654,066 B2 * | 5/2017 | Leong | H03F 1/0205 |
| 10,250,188 B2 | 4/2019 | Lin et al. | |
| 10,411,745 B1 | 9/2019 | Huang et al. | |
| 10,608,661 B1 * | 3/2020 | Gruber | H03M 1/66 |
| 10,979,038 B2 | 4/2021 | Frounchi et al. | |
| 2019/0356348 A1 | 11/2019 | Nguyen et al. | |
| 2019/0372576 A1 | 12/2019 | Jung et al. | |

* cited by examiner

TRANSFORMER-BASED CURRENT-REUSE AMPLIFIER WITH EMBEDDED IQ GENERATION FOR COMPACT IMAGE REJECTION ARCHITECTURE IN MULTI-BAND MILLIMETER-WAVE 5G COMMUNICATION

CROSS-REFERENCE TO RELATED APPLICATIONS

This application is a divisional application of U.S. patent application Ser. No. 16/951,330, filed on Nov. 18, 2020, which is incorporated by reference herein in its entirety.

FIELD OF THE INVENTION

Embodiments of the present invention relate generally to wireless communication devices. More particularly, embodiments of the invention relate to a compact image rejection architecture using transformer-based current-reused IQ amplifiers for a communication device.

BACKGROUND

For next-generation 5G communication devices with high capacity requirements, a higher data rate is required for many applications such as autonomous smart radar system, 5G new radio (NR)/6G beyond communication, and high speed Internet of Things (IoT)/millimeter-wave (mm-Wave) Satellite networking. A design shifts toward mm-Wave frequency bands, including Ka-band (24-40 Gigahertz (GHz)), V-band (40-75 GHz), E-band (71-95 GHz), W-band (75-110 GHz), and D-band (110-170 GHz), supports this higher data rate requirement. Because extreme broadband channel can be susceptible to unwanted image signals, advanced transceiver (TRX) architecture for mm-Wave communication relies on a reliable image rejection (IR) architecture.

Additionally, because mm-Wave circuit or system design often adopts a considerable amount of inductors or transformers to resonate the parasitic capacitors and peak up the current gain, mm-Wave circuit or system requires a large area to accommodate such design. Further, in order to create wideband In-phase/Quadrature-phase (IQ) signals for IR architectures, high-order resistor-capacitor based RC-CR Poly-Phase Filters (PPFs) are often used in RF frequency operations. However, RC-CR PPFs may have limitations such as a large signal attenuation, a highly capacitive input loading, a limited driving capability at mm-Wave, and vulnerable to mm-Wave trace routings and output load variations. Thus, the use of RC-CR PPFs in wideband mm-Wave local oscillator (LO)-paths often demands more LO power to compensate for its signal loss which in turn causes power penalty in LO drivers. Moreover, multi-bit capacitor tuning banks may be required for the LO RC-CR PPF to extend its operation bandwidth and to achieve wideband Image Rejection Ratio (IRR). Extensive open-loop calibrations are needed to ensure sufficient signal-to-noise ratio (SNR) and IRR. However, extensive loop calibrations can increase reconfiguration latency and system complexity for 5G links.

To achieve high current gain and compensate signal loss for parasitic capacitors, inductive loadings are typically used to extend active device operation bandwidth with higher current gain at higher frequency. However, in a conventional design, the active amplifiers with inductive loads are designed separately with the transformer-based IQ. Thus, multiple inductive structures or transformers are required to achieve wideband gain extension and IQ generation simultaneously, which are bulky and often difficult to integrate.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
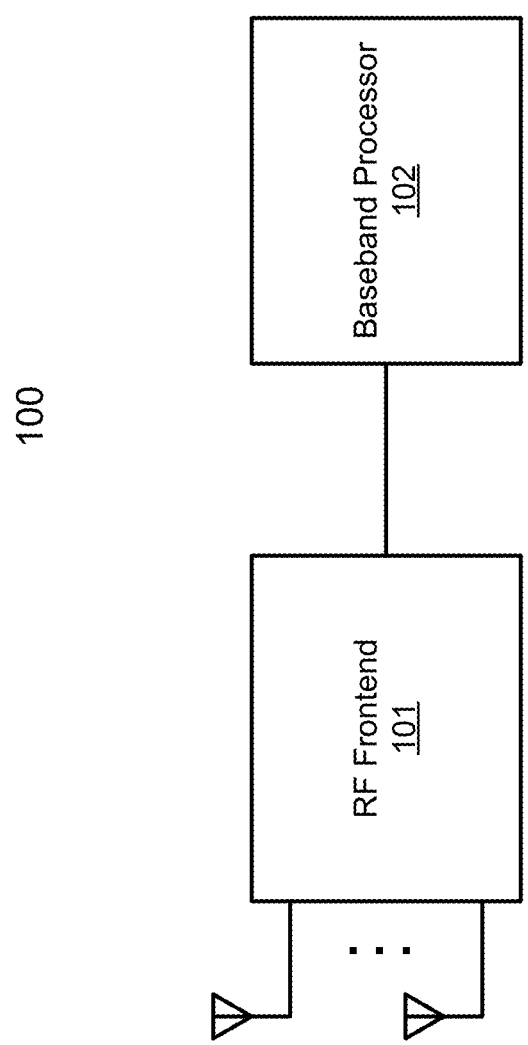
FIG. 1 is a block diagram illustrating an example of a wireless communication device according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

For purposes of the embodiments described herein, unless otherwise specified, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors-BJT PNP/NPN, BiCMOS, CMOS, etc., may be used without departing from the scope of the disclosure.

According to one aspect, a transformer-based in-phase and quadrature (IQ) includes a differential balun having a first inductor and a second inductor. The first inductor has a first input terminal and a first output terminal. The second inductor has a second input terminal and a second output terminal. Additionally, the IQ generator circuit includes a third inductor magnetically coupled with the first inductor. The third inductor has a first isolation terminal and a third output terminal. The IQ generator circuit also includes a fourth inductor magnetically coupled with the second inductor. The fourth inductor has a second isolation terminal and a fourth output terminal. The IQ generator circuit additionally includes a first transistor coupled to the first input terminal of the first inductor. Further, the generator circuit includes a second transistor coupled to the second input terminal of the second inductor. The first transistor, the second transistor, the first inductor, and the second inductor form part of a differential amplifier.

In one embodiment, the IQ generator circuit further includes a first resistor coupled to between the first isolation terminal of the third inductor and a voltage source. In addition, the IQ generator circuit includes a second resistor coupled to between the second isolation terminal of the fourth inductor and the voltage source.

In one embodiment, the IQ generator circuit also includes a third resistor coupled between the third output terminal and the voltage source. The IQ generator circuit further includes a fourth resistor coupled between the fourth output terminal and the voltage source.

In one embodiment, the first resistor and the third resistor are configured to have resistance such that an amount of direct current (DC) flowing through the third inductor is below a first predetermined threshold.

In one embodiment, the second resistor and the fourth resistor are configured to have resistance such that that an amount of direct current (DC) flowing through the fourth inductor is below a second predetermined threshold.

In one embodiment, the IQ generator circuit further includes a fifth resistor coupled between the first output terminal and a voltage source. The IQ generator circuit also includes a sixth resistor coupled between the second output terminal and the voltage source.

In one embodiment, the first output terminal represents a positive in-phase (I+) output terminal to output an I+ signal. In addition, the second output terminal represents a negative in-phase (I−) output terminal to output an I− signal.

In one embodiment, the third output terminal represents a negative quadrature-phase (Q−) output terminal to output a Q− signal. Additionally, the fourth output terminal represents a positive quadrature-phase (Q+) output terminal to output a Q+ signal.

In one embodiment, the inputs of the first and second transistors are configured to receive differential input signals.

In one embodiment, the IQ generator circuit also includes a third transistor coupled between the first transistor and the first input terminal. The IQ generator circuit additionally includes a fourth transistor coupled between the second transistor and the second input terminal. The first inductor, the second inductor, the first transistor, the second transistor, the third transistor, and the fourth transistor can form a part of a cascode amplifier.

According to another aspect, a transformer-based IQ combiner circuit with an integrated amplifier can include a differential balun including a first inductor and a second inductor. The first inductor may have a first input terminal and a first output terminal. The second inductor may have a second input terminal and a second output terminal. The combiner circuit can also include a third inductor magnetically coupled with the first inductor. The third inductor may have a first isolation terminal and a third input terminal. Additionally, the combiner circuit can include a fourth inductor magnetically coupled with the second inductor. The fourth inductor may have a second isolation terminal and a fourth input terminal. The combiner circuit may additionally include a first transistor coupled to the first input terminal of the first inductor. Further, a second transistor coupled to the second input terminal of the second inductor, wherein the first transistor, the second transistor, the first inductor, and the second inductor form a part of an in-phase differential amplifier.

FIG. 1 is a block diagram illustrating an example of a wireless communication device according one embodiment of the invention. Referring to FIG. 1, wireless communication device 100, also simply referred to as a wireless device, includes, among others, an RF frontend module 101 and a baseband processor 102. Wireless device 100 can be any kind of wireless communication device such as, for example, mobile phones, laptops, tablets, network appliance devices (e.g., Internet of thing or IOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower frequency, e.g., IF. In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip further includes an IQ generator and/or a frequency synthesizer coupled to the RF transceivers. The IQ generator or generation circuit generates and provides an LO signal to each of the RF transceivers to enable the RF transceiver to mix, modulate, and/or demodulate RF signals within a corresponding frequency band. The RF transceiver(s) and the IQ generation circuit may be integrated within a single IC chip as a single RF frontend IC chip or package.

Figure 2:
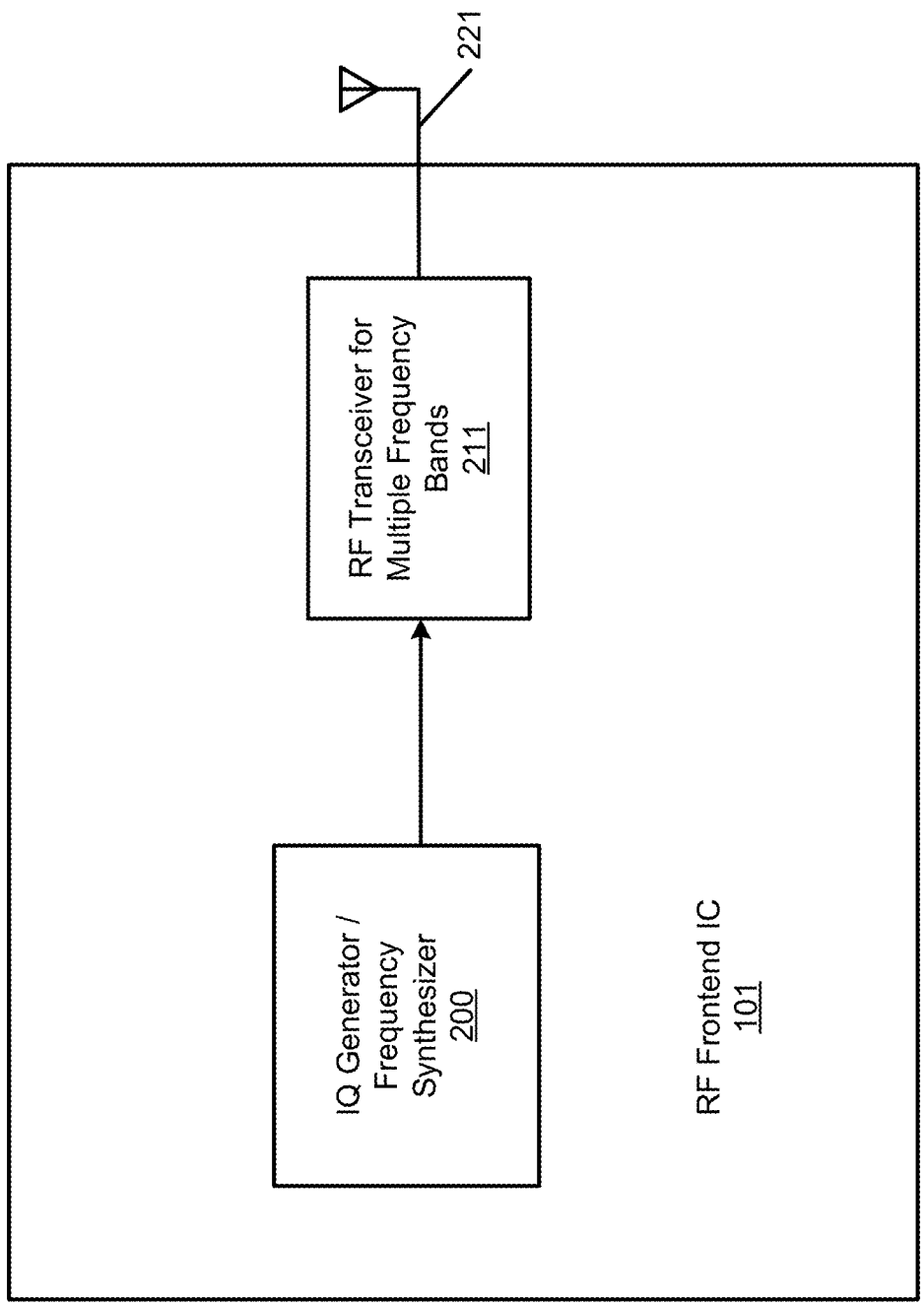
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, among others, an IQ generator and/or frequency synthesizer 200 coupled to a RF transceiver 211. Transceiver 211 is configured to transmit and receive RF signals within one or more frequency bands or a broad range of RF frequencies via RF antenna 221. In one embodiment, transceiver 211 is configured to receive one or more LO signals from frequency synthesizer 200. The LO signals are generated for the one or more corresponding frequency bands. The LO signals are utilized to mix, modulate and are demodulated by the transceiver for the purpose of transmitting and receiving RF signals within corresponding frequency bands. Although there is only one transceiver and antenna shown, multiple pairs of transceivers and antennas can be implemented, one for each frequency band.

Described herein is a transformer-based design IQ generation combining into and co-designing with amplifier gain and bandwidth expansion. Two different scenarios of Transmitter(TX)/Receiver(RX) will be described in details (see FIGS. 3A-3D) to demonstrate various co-design methods in both transmitter and receiver architecture. Moreover, inductive design to enhance amplifier operation at mm-Wave frequency is further mutually and inductively coupled to create transformer-based current reuse topology to reduce size and power consumption. As a result, an ultra-compact wideband image-rejection system and circuit design can be implemented to support the next-generation 5G communication devices (e.g., wideband remote radio unit) with high capacity requirements.

Figure 3A:
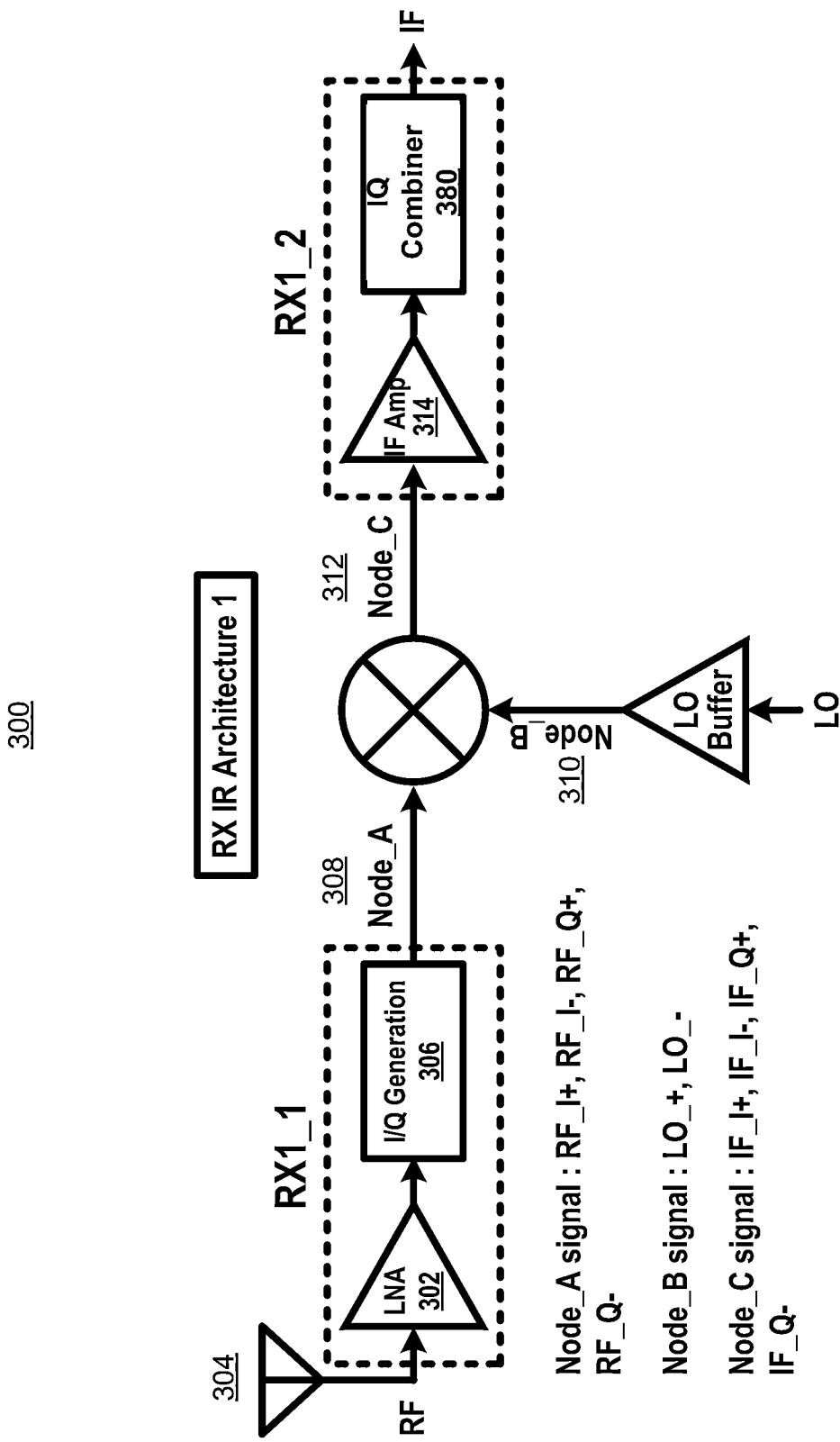
FIGS. 3A-3B are block diagrams illustrating an example of a RX/TX IR architecture according to one embodiment.

FIGS. 3A-3D are block diagrams illustrating an example of two types of image rejection architecture for TX and RX design according to one embodiment. Referring to FIG. 3A, for example, in RX IR architecture 300 and TX IR architecture 340, the differential IQ generation may be associated with RX/TX front end as well as with IF amplifiers to achieve wideband image rejection. To achieve a better input receiver sensitivity, the wideband low noise amplifier (LNA) 302 may be used as a first-stage amplifier. In one embodiment, an RX chain may receive an RF signal, via the antenna (e.g., differential-ended antenna 304), from a remote device and the RF signal is amplified by the wideband LNA 302. As shown, the wideband LNA 302 input may be directly connected to differential-ended antenna 304. The wideband LNA 302 output is fed into the differential IQ generation block 306.

Based on the differential input provided by LNA 302, IQ generation block 306 (also simply referred to as an IQ generator) generates an in-phase differential output (I+/I−) and a quadrature differential output (Q+/Q−). The I+/I− and Q+/Q− signals are then down-converted based on an LO signal 310 into intermediate frequency (IF) I+/I− and Q+/Q− signals. The IF_I+/I− and Q+/Q− signals are then fed to an IQ combiner 380 (with optional amplified by an IF amplifier 314), which combines the IF_I+/I− and Q+/Q− signals into IF differential output signals to be processed by other downstream components such as a baseband processor or digital signal processor (DSP). In one embodiment, LNA 302 and IQ generator 306 may be co-designed to form a transformer-based IQ generator circuit integrated with an amplifier therein, which is represented by a dotted block RX1_1. The term of "co-design" refers to designing and configuring the parameters of the IQ generator 306 and LNA 302 altogether to achieve optimum performance, which will be described in details further below.

Figure 3B:
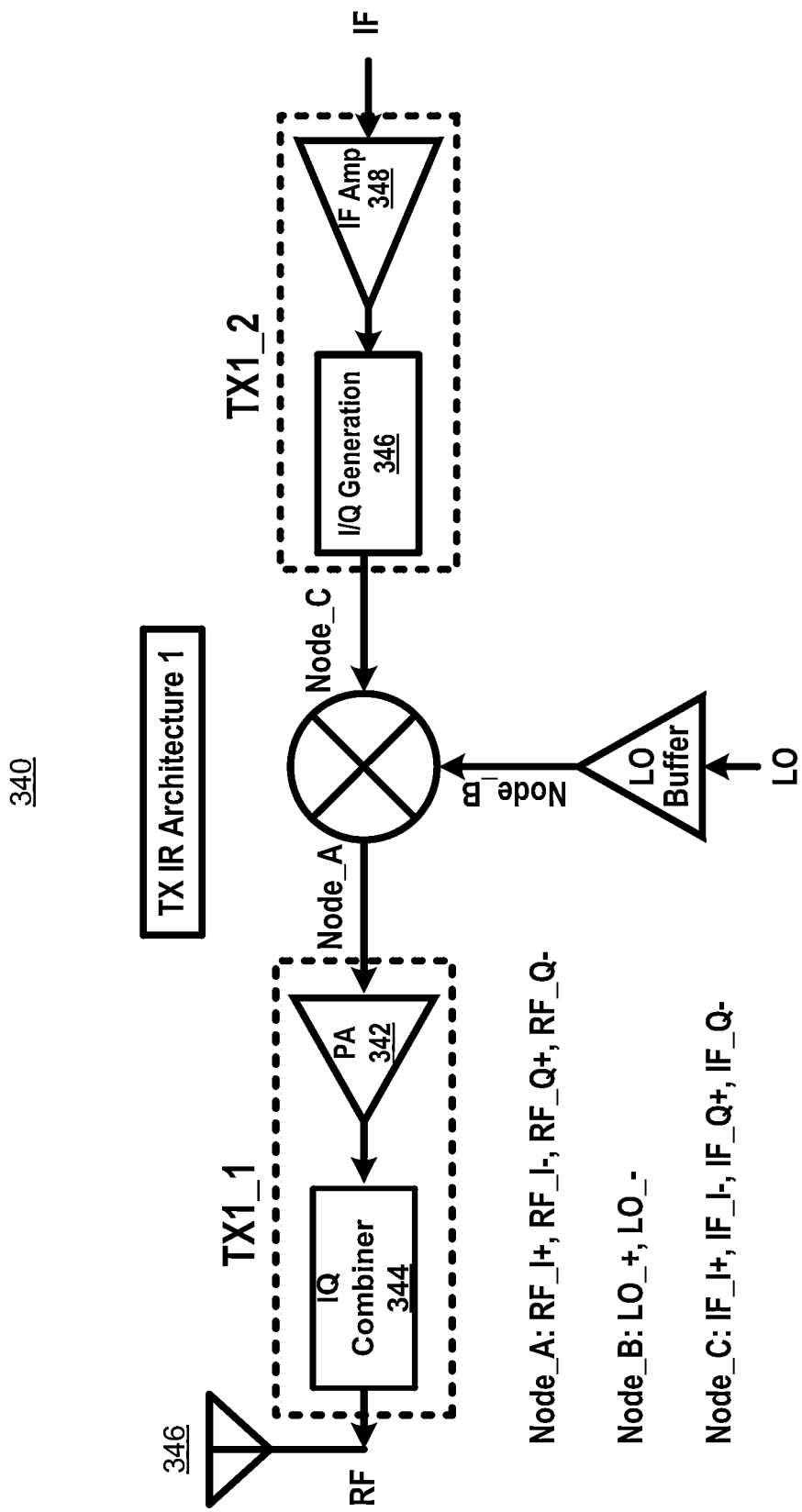

As illustrated in FIG. 3B, which represents an RF transmitter, the wideband power amplifier (PA) 342 differential output is connected to the differential IQ combiner block 344 and then co-designed to differential-ended antenna 346 for maximizing the output power and transmitter efficiency. For the TX/RX IR architecture 1 as depicted in FIGS. 3A-3B, differential IQ generation may be processed in the RX/TX frontends and the IF amplifiers with the node A signal 308 including RF_I+, RF_I−, RF_Q+, RF_Q−, the node B signal 310 including LO_+, LO_−, and the node C signal 312 including IF_I+, IF_I−, IF_Q+, IF_Q−. In one embodiment, IQ combiner 344 and PA 342 are co-designed represented by transformer-based block TX1_1, and similarly, the IQ generator 346 and IF amplifier 348 are co-designed represented by transformer-based block TX1_2.

Figure 3C:
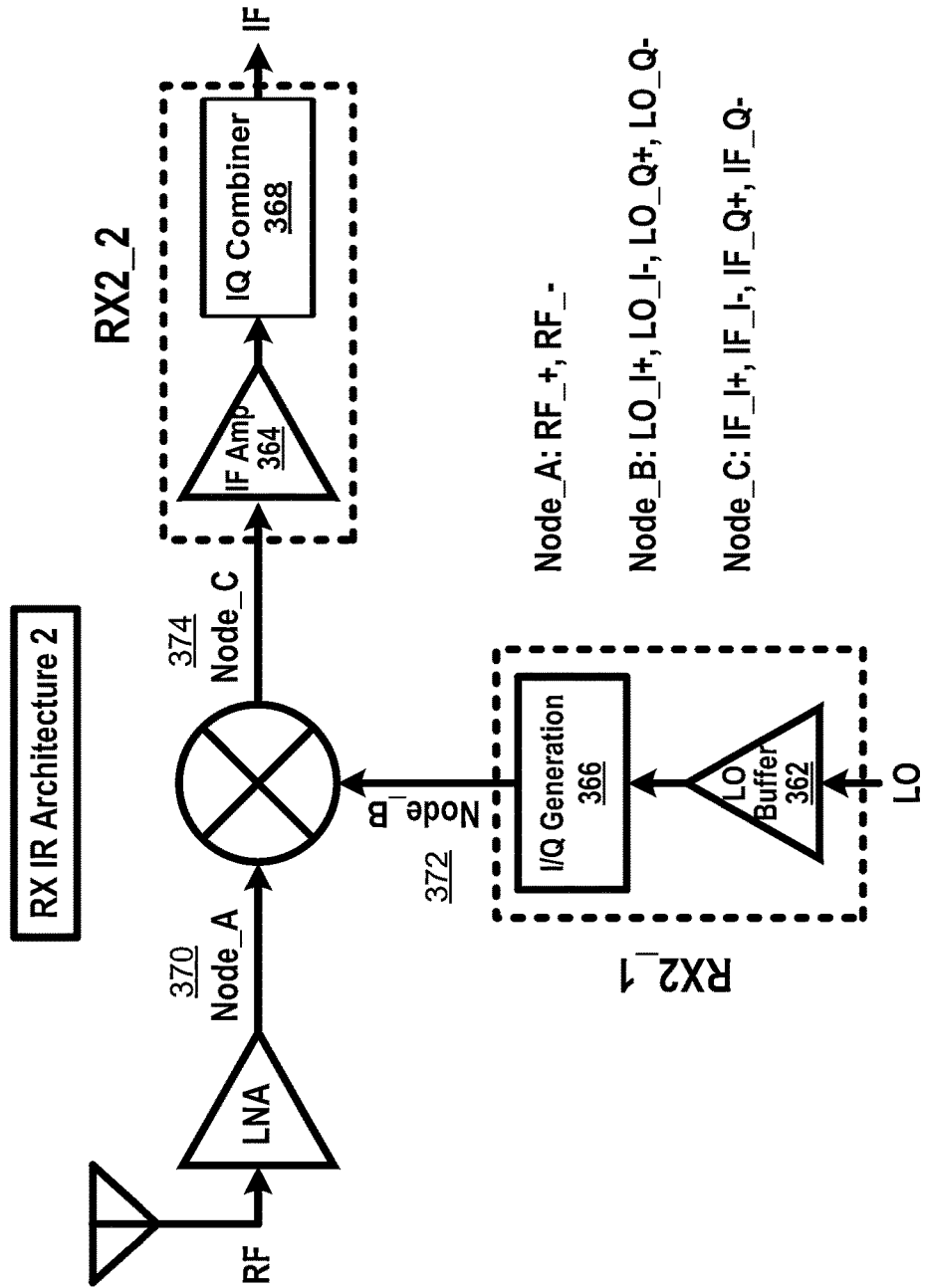
FIGS. 3C-3D are block diagrams illustrating an example of a RX/TX IR architecture according to one embodiment.
Figure 3D:
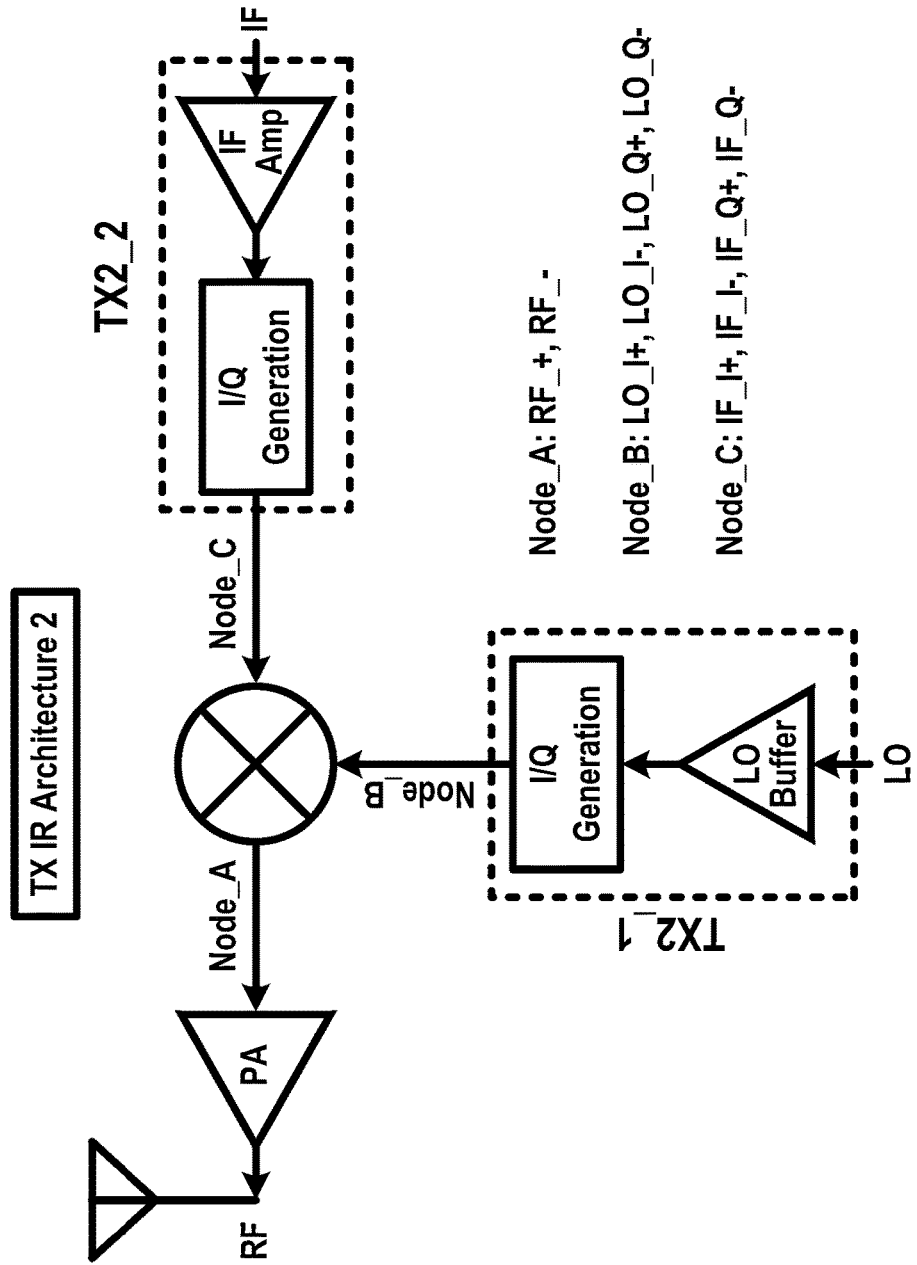

In another embodiment as illustrated in FIGS. 3C-3D, the differential IQ generation may be associated with LO generation as well as with IF amplifiers to achieve wideband image rejection. As shown, for the TX/RX IR architecture 2 (e.g., 360 and 390), differential IQ generation can be processed in the LO generation with the node A 370 signal including RF_+, RF_−, the node B 372 signal including LO_I+, LO_I−, LO_Q+, LO_Q−, and the node C 374 signal including IF_I+, IF_I−, IF_Q+, IF_Q−. The differential IQ generation is preceded with LO buffers 362 and the IF amplifiers 364. For example, as illustrated in FIG. 3C, the output of the LO buffer 362 is fed into the I/Q generation block 366. The output of IF amplifier 364 is fed into the IQ combiner block 368.

In one embodiment, the IQ generation can be co-designed to provide IQ signal generation with amplifiers for differential signal inputs and differential IQ signal outputs. In this scenario, blocks RX1_1, RX2_1, TX1_2, TX2_1, and TX2_2 are referred (see FIGS. 3A-3D). In a second scenario, the IQ generation can be co-designed to provide differential IQ signal inputs and combined with differential IQ amplifiers for differential signal outputs to finish image rejection. In this second scenario, RX1_2, RX2_2, and TX1_1 can be referred.

Figure 4:
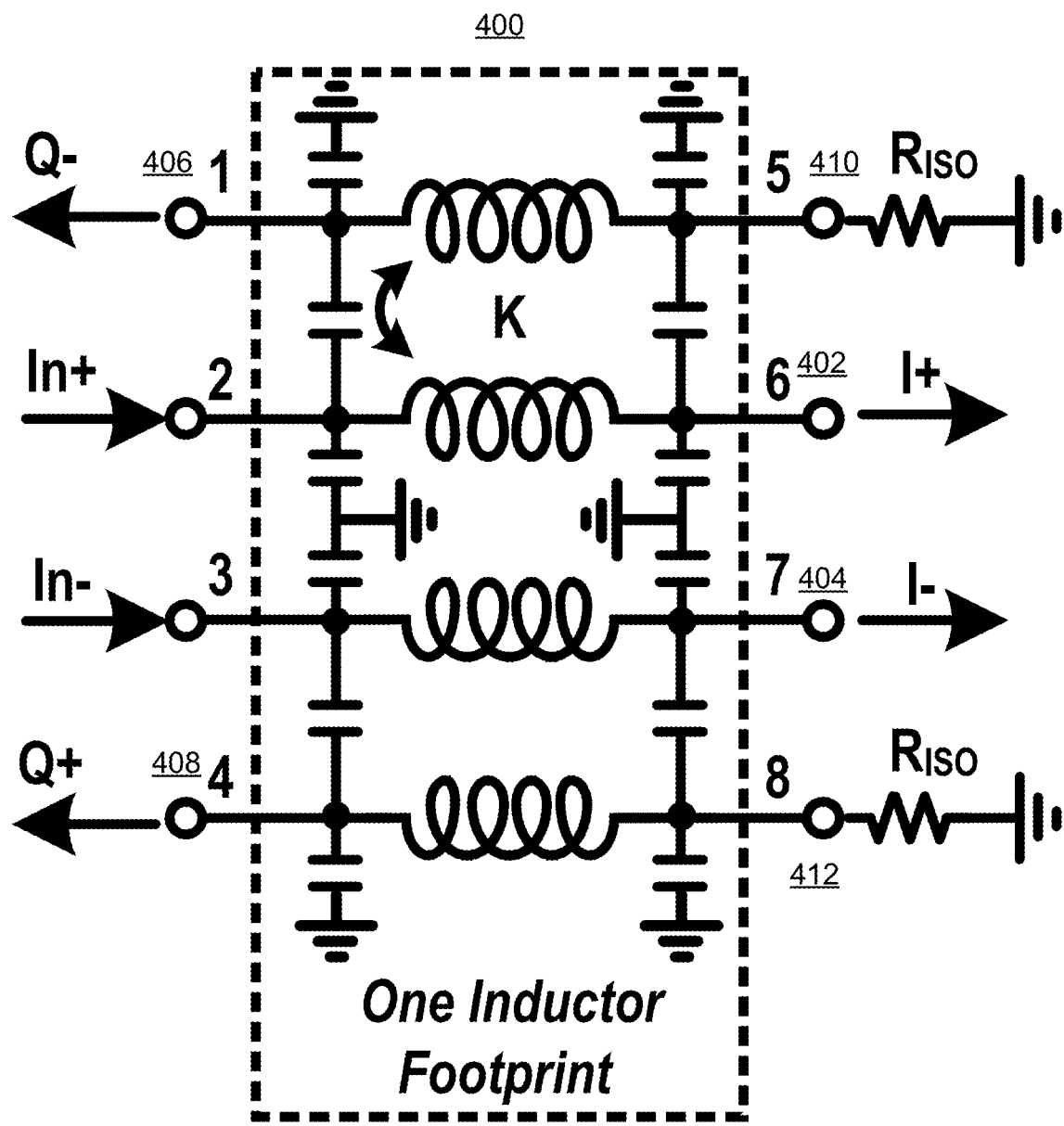
FIG. 4 is a block diagram illustrating a differential transformer-based IQ generator circuit according to one embodiment.

FIG. 4 illustrates an example of a differential transformer based IQ generation 400. As shown, the embodiment of the differential IQ generation is utilized via transformer-based structure to achieve a low-loss performance for generating differential in-phase signal I (I+ and I− at terminals 402 and 404) and quadrature signal Q (Q+ and Q− at terminals 406 and 408) based on a differential input (In+, In−). $R_{ISO}$ can be a loading impedance at isolation terminals 410 and 412 for the IQ generation. In this present disclosure, reused current inductive/transformer-based design concept is used to co-design and build ultra-compact active current IQ generation amplifier.

Figure 5A:
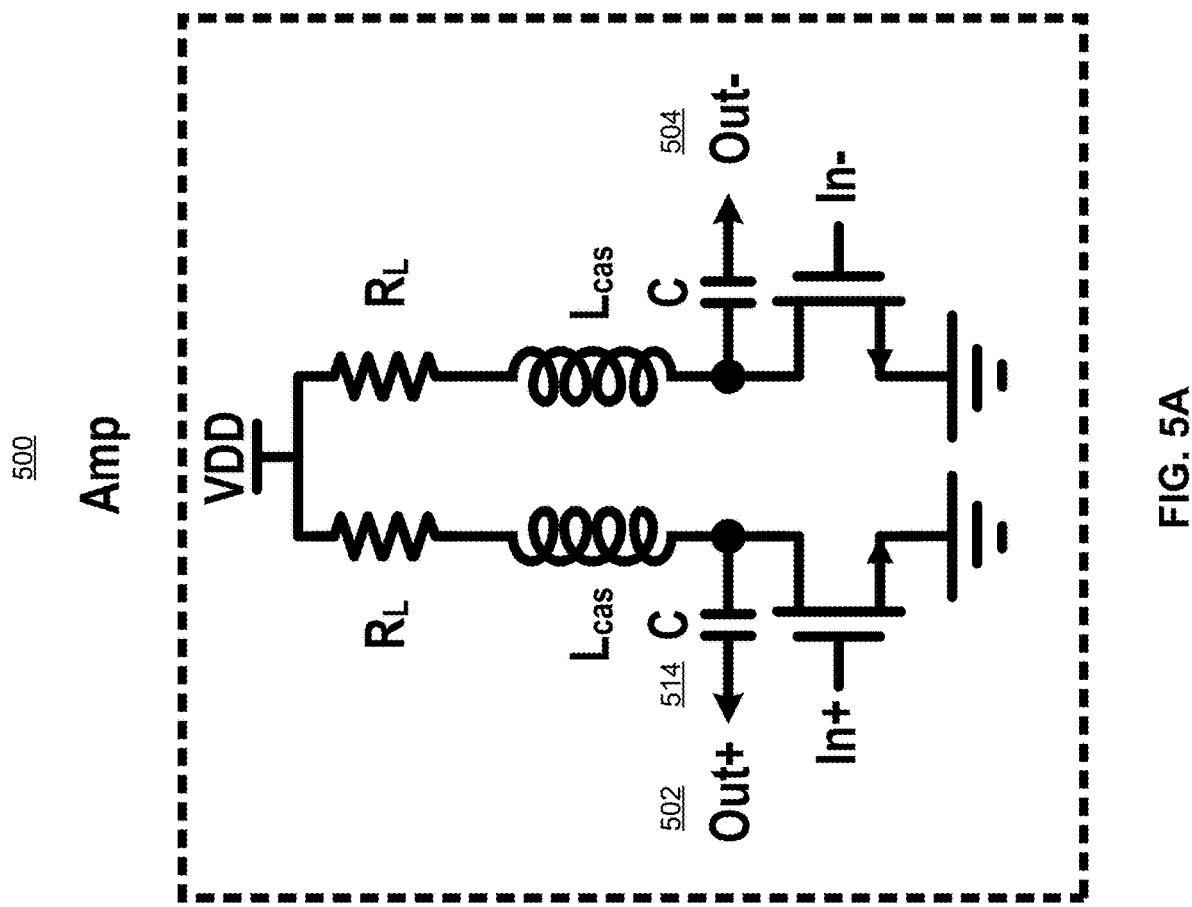
FIGS. 5A-5B are block diagrams illustrating an example of a conventional amplifier and a differential transformer-based IQ generator circuit according to one embodiment.
Figure 5B:
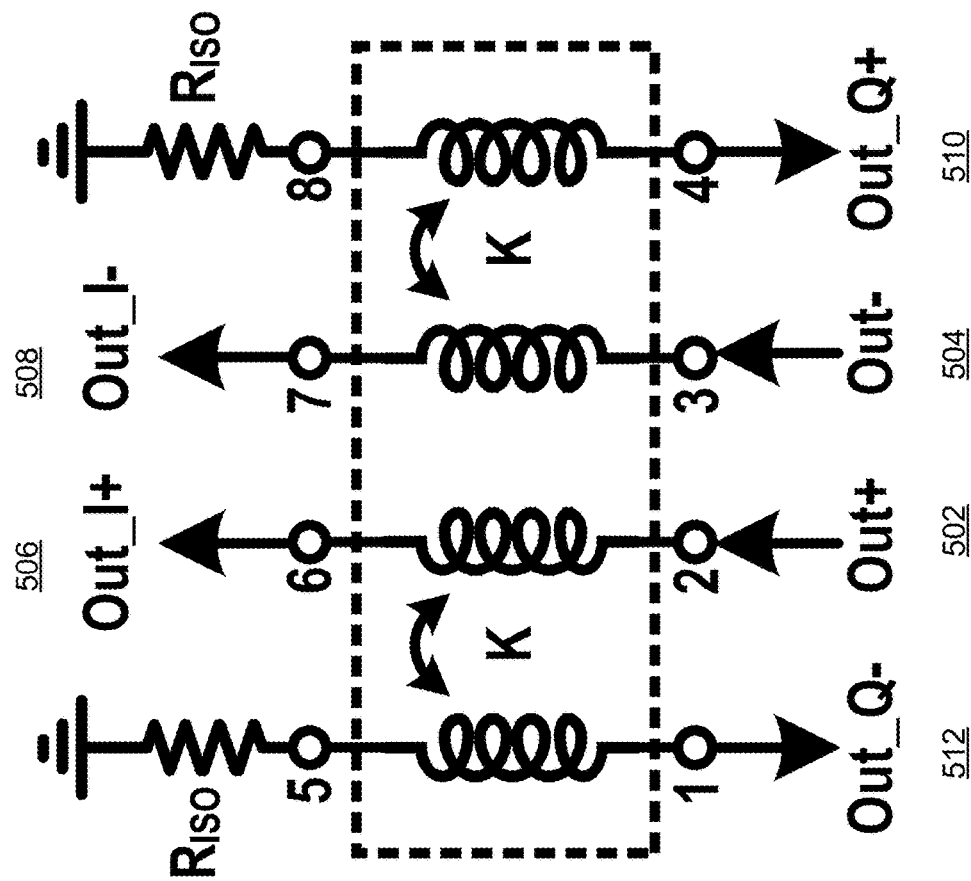

Referring to FIG. 5A, in conventional design of an amplifier, a differential signal (e.g., In+ and In−) is amplified by the differential amplifier 500 with inductive load to generate the differential output (Out+ 502 and Out− 504). Thereafter, the differential output (Out+ 502 and Out− 504) is fed into transformer-based differential IQ generation to generate signals including Out_I+ 506, Out_I− 508, Out_Q+ 510, and Out_Q− 512 (see FIG. 5B). The capacitor, C 514 (see FIG. 5A) at an amplifier output is used as DC-block to create an independent biasing point as it connects to the transformer-based IQ generation.

Figure 6:
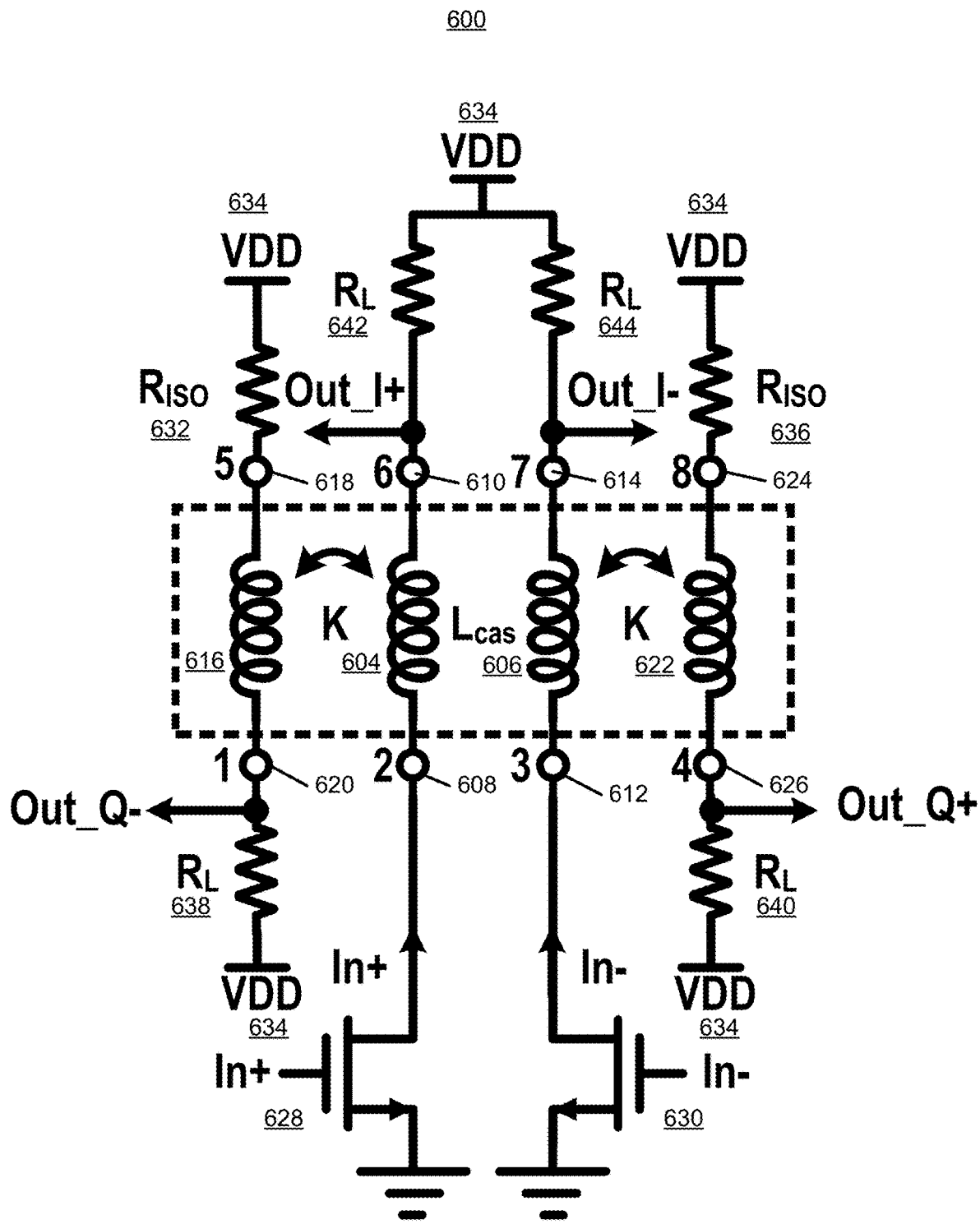
FIG. 6 is a block diagram illustrating a transformer-based IQ generator circuit with an integrated amplifier circuit according to one embodiment.

FIG. 6 illustrates an example of a transformer-based in-phase and quadrature (IQ) generator circuit with an integrated amplifier according to an embodiment. In some embodiments, the IQ generator circuit 600 can include a differential balun having a first inductor 604 and a second inductor 606. As shown, the first inductor 604 can have a first input terminal 608 and a first output terminal 610. The second inductor 606 can have a second input terminal 612 and a second output terminal 614. Additionally, the IQ generator circuit 600 can include a third inductor 616 magnetically coupled with the first inductor 604. The third inductor can have a first isolation terminal 618 and a third output terminal 620. The IQ generator circuit 600 can also include a fourth inductor 622 magnetically coupled with the second inductor 606. The fourth inductor 622 can have a second isolation terminal 624 and a fourth output terminal 626. The IQ generator circuit 600 can additionally include a first transistor 628 coupled to the first input terminal 608 of the first inductor 604. Further, the generator circuit 600 can include a second transistor 630 coupled to the second input terminal 612 of the second inductor 606.

In one embodiment, the first transistor 628, the second transistor 630, the first inductor 604, and the second inductor 606 form a part of a differential amplifier. In this example, the collector of the transistor 628 is coupled to the first input terminal 608, while its emitter is coupled to the ground. The base of the transistor 628 represents a differential input terminal to receive a differential input signal In+. Similarly, the collector of transistor 630 is coupled to the second input terminal 612, while its emitter is coupled to the ground. The base of transistor 630 represents a differential input terminal to receive a differential input signal In−.

In one embodiment, the IQ generator circuit 600 can include a first resistor 632 coupled to between the first isolation terminal 618 of the third inductor 616 and a voltage source. Additionally, the IQ generator circuit 600 can include a second resistor 636 coupled to between the second isolation terminal 624 of the fourth inductor 622 and the voltage source 634.

In one embodiment, the IQ generator circuit 600 can include a third resistor 638 coupled between the third output terminal 620 and the voltage source. The IQ generator circuit 600 can also include a fourth resistor 640 coupled between the fourth output terminal 626 and the voltage source 634.

In one embodiment, the first resistor 632 and the third resistor 638 can be configured to have resistance such that an amount of direct current (DC) flowing through the third inductor 616 is below a first predetermined threshold.

In one embodiment, the second resistor 636 and the fourth resistor 640 can be configured to have resistance such that an amount of direct current (DC) flowing through the fourth inductor 622 is below a second predetermined threshold.

In one embodiment, the IQ generator circuit 600 can include a fifth resistor 642 coupled between the first output terminal 610 and a voltage source 634. Additionally, the IQ generator circuit 600 can include a sixth resistor 644 coupled between the second output terminal 614 and the voltage source 634.

In one embodiment, the first output terminal 610 may represent a positive in-phase (I+) output terminal to output an I+ signal. The second output terminal 614 may represent a negative in-phase (I−) output terminal to output an I− signal.

In one embodiment, the third output terminal 620 may represent a negative quadrature-phase (Q−) output terminal to output a Q− signal. The fourth output terminal 626 may represent a positive quadrature-phase (Q+) output terminal to output a Q+ signal.

In one embodiment, inputs of the first transistor 628 and second transistor 630 can be configured to receive differential input signals.

The parameters of the amplifier and the IQ generator circuit are co-designed. For example, the gain of the amplifier may be determined based on the load resistors 638 and 640, as well as the coupled inductor turn ratio K. On the other hands, the pair of resistors 632 and 638 are designed with proper impedance, such that the DC current flowing through inductor 616 can be substantially eliminated or reduced. Similarly, the pair of resistors 636 and 640 are designed with proper impedance, such that the DC current flowing through inductor 622 can be substantially eliminated or reduced.

Because of the inductive load Lcas an amplifier is first coupled as a differential transformer-based balun, these multi-inductors/transformers can reduce a bulky conventional design. Then, a transformer-based balun can be coupled with two inductors to form a differential IQ generation as illustrated in FIG. 6. To provide load impedance for the amplifier, the third output terminal 620, fourth output terminal 626, the first output terminal 610, and the second output terminal 614 can be loaded with RL to provide amplifier desired output impedance. The amplifier combines the inductive load to enhance current gain and further reuse the current to form transformer-based IQ generator circuit.

Moreover, to provide correct VDD biasing, the output load RL on the third output terminal 620, fourth output terminal 626, the first output terminal 610, and the second output terminal 614 can be connected to a voltage source 634. Since inductors or transformers are DC-short circuit, the biasing on the $R_{ISO}$ in the first isolation terminal 618 and the second isolation terminal 624 are still VDD to make sure that there is no DC current flow between the third output terminal 620 and the first isolation terminal 618 to avoid extra DC power consumption in the paths on the third output terminal 620 and the first isolation terminal 618.

Similarly, for the reason discussed above, there is no DC current flow between the fourth output terminal 626 and the second isolation terminal 624 to avoid extra DC power consumption in the paths on the fourth output terminal 626 and the second isolation terminal 624. In FIG. 6, the $R_{ISO}$ is now connected to VDD in comparison to GND in FIG. 5B, which remain the property of the differential IQ generation operation. This is because the GND or VDD DC-biasing for RF signal are served as RF-short. Therefore, the proposed architecture 600 as described above in FIG. 6 can reuse the current and co-design with the differential IQ generation with an ultra-compact area without consuming any extra DC power penalty. In addition, the proposed architecture 600 does not require a capacitor at amplifier outputs as shown in FIG. 5A which is lossy at RF frequency.

Figure 7:
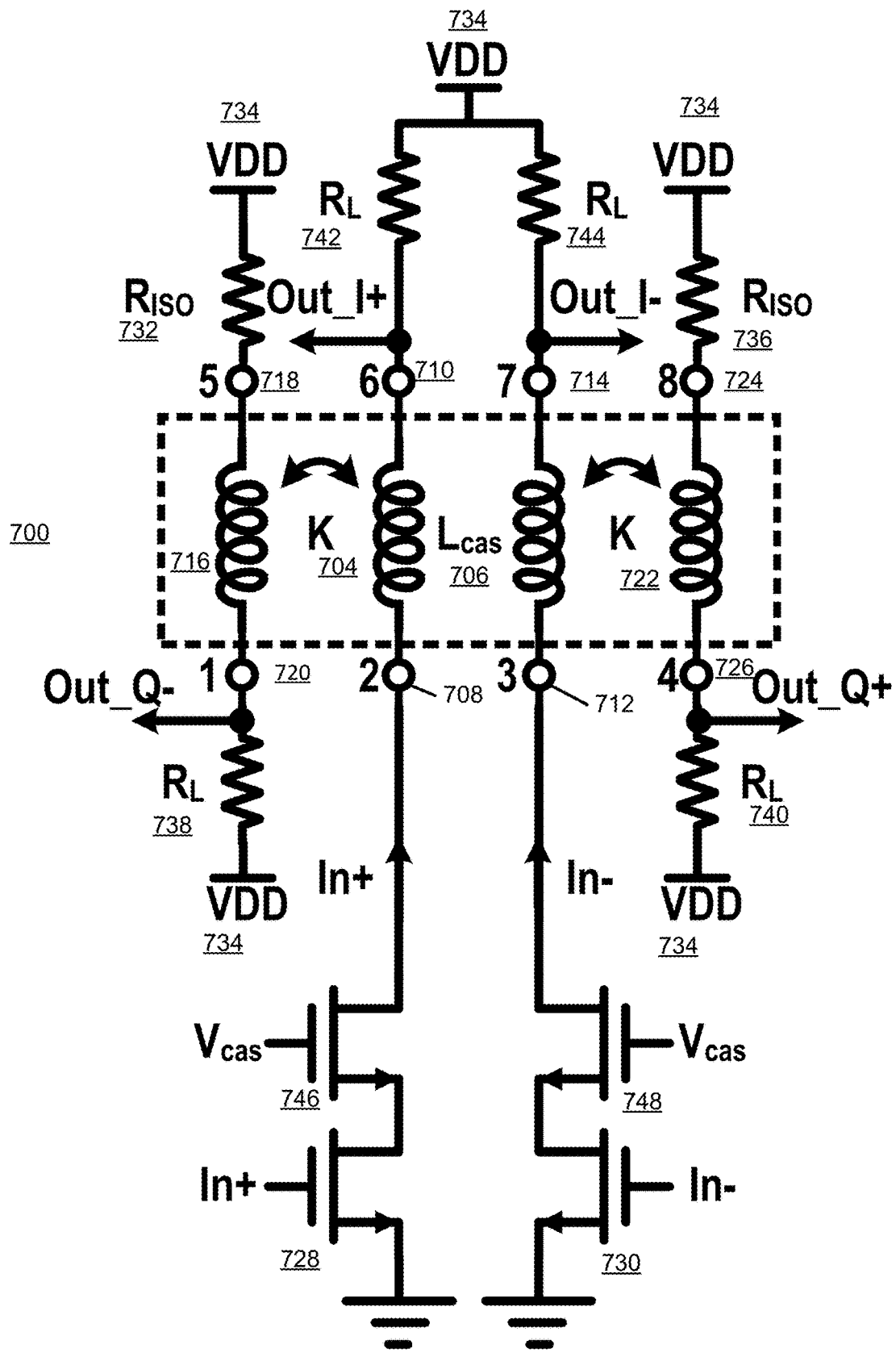
FIG. 7 is a block diagram illustrating a cascode transformer-based IQ generator circuit with an integrated amplifier circuit according to one embodiment.

FIG. 7 illustrates an example of a transformer-based in-phase and quadrature (IQ) generator circuit according to an embodiment. The architecture 600 described in FIG. 6 can be extended to a cascode amplifier design for large output swing enhancement with largely area saving and bandwidth extension. The architecture 600 can be adaptable and scalable in the case for (a): IQ signal generation with amplifiers for differential signal inputs and differential IQ signal outputs, i.e., in building blocks cases: RX1_1, RX2_1, TX1_2, TX2_1, and TX2_2. In one embodiment, the IQ generator circuit 700 can include a third transistor 746 coupled between the first transistor 728 and the first input terminal 708. The IQ generator circuit 700 can additionally include a fourth transistor 748 coupled between the second transistor 730 and the second input terminal 712. The first inductor 704, the second inductor 706, the first transistor 728, the second transistor 730, the third transistor 746, and the fourth transistor 748 form a part of a cascode amplifier.

A cascode amplifier is a two-stage amplifier that consists of a common-emitter stage feeding into a common-base stage. Compared to a single amplifier stage, a cascode amplifier may have higher input-output isolation, higher input impedance, higher output impedance, and higher bandwidth. As shown in FIG. 7, the collector of transistor 746 is coupled to input terminal 708, while its emitter is coupled to the collector of transistor 728. The base of transistor 746 may be coupled to a predetermined voltage (Vcas). Similarly, the collector of transistor 748 is coupled to input terminal 712, while its emitter is coupled to the collector of transistor 730. The base of transistor 748 may be coupled to a predetermined voltage (Vcas). In one embodiment, transistors 728, 730, 746, and 748 may be field-effect transistors (FETs).

Figure 8A:
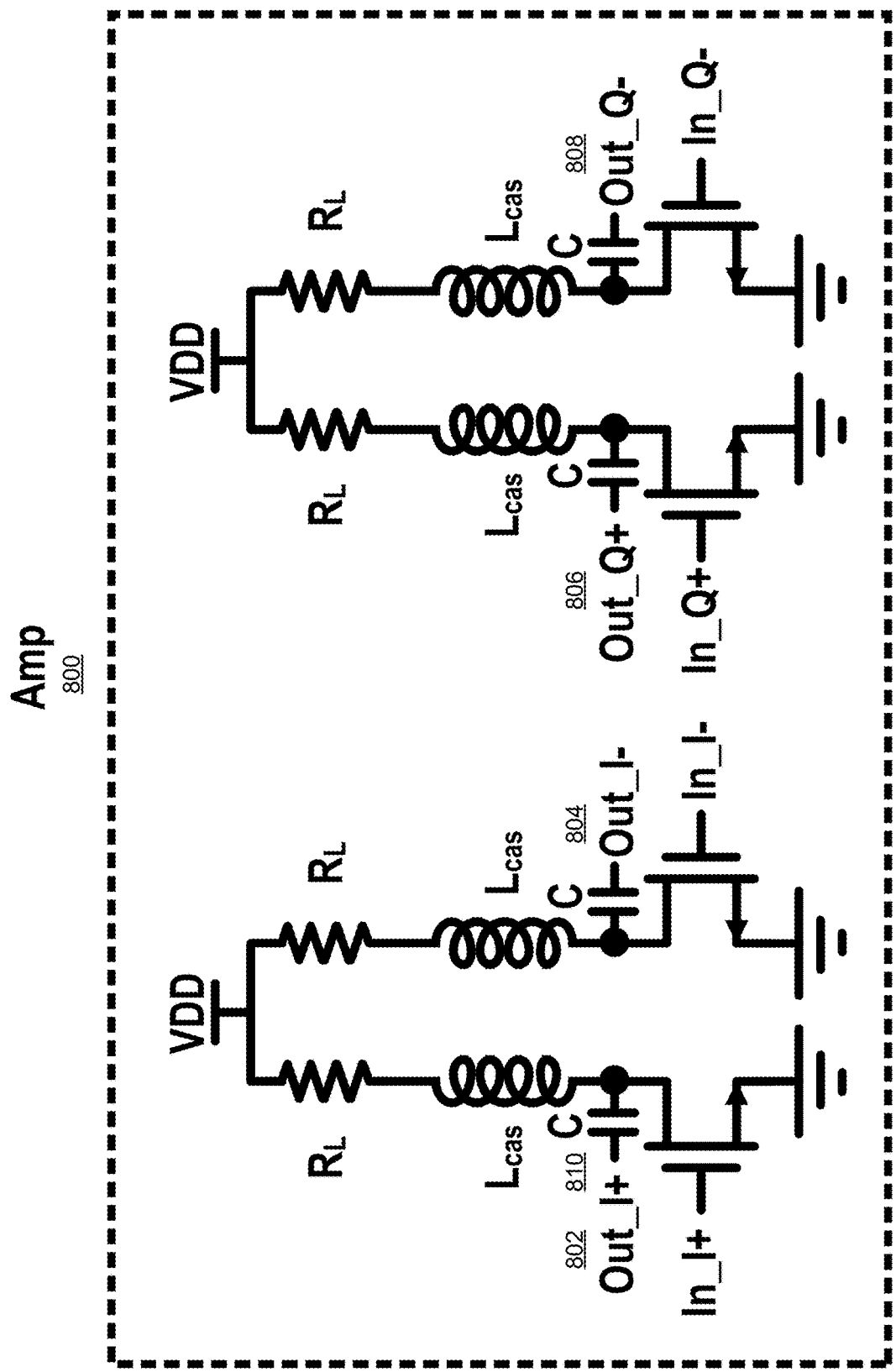
FIGS. 8A-8B are block diagrams illustrating an example of a conventional amplifier and a differential transformer-based IQ generator circuit according to one embodiment.
Figure 8B:
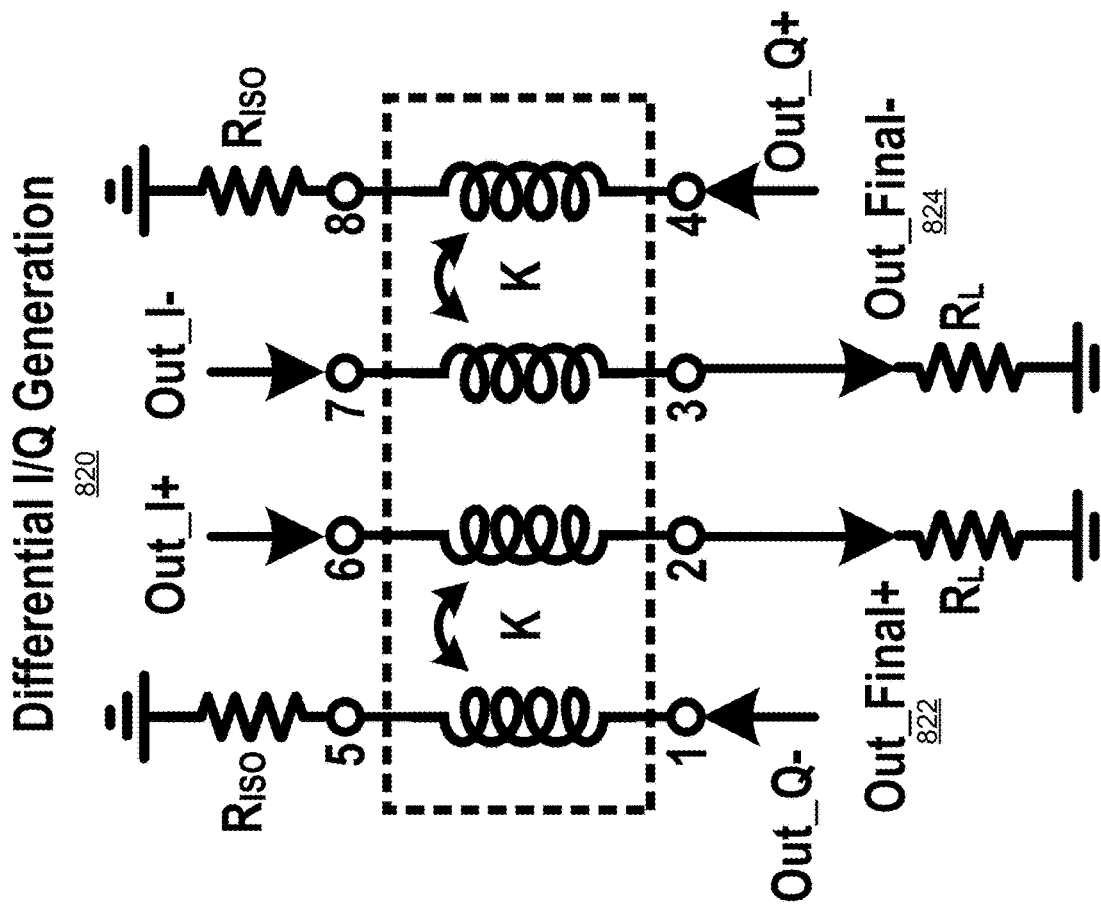

FIGS. 8A-8B illustrate an example of a conventional amplifier and a differential transformer-based IQ combiner circuit according to one embodiment. Consider blocks RX1_2, RX2_2, and TX1_1 (see FIGS. 3A, 3B, and 3C), in conventional design, differential IQ signal is amplified by the differential IQ amplifier 800 with inductive load and then the differential IQ output signals (Out_I+ 802, Out_I− 804, Out_Q+ 806, and Out_Q− 808) are fed into transformer-based differential IQ combiner 820 (see FIG. 8B) for IQ signal combination and image rejection. Thus, final differential output (Out_Final+ 822 and Out_Final− 824) can be generated. As shown in FIG. 8A, the capacitor (e.g., 810) at the amplifier output is used as DC-block to make independent biasing point as it connects to the transformer-based IQ combiner 820.

Figure 9:
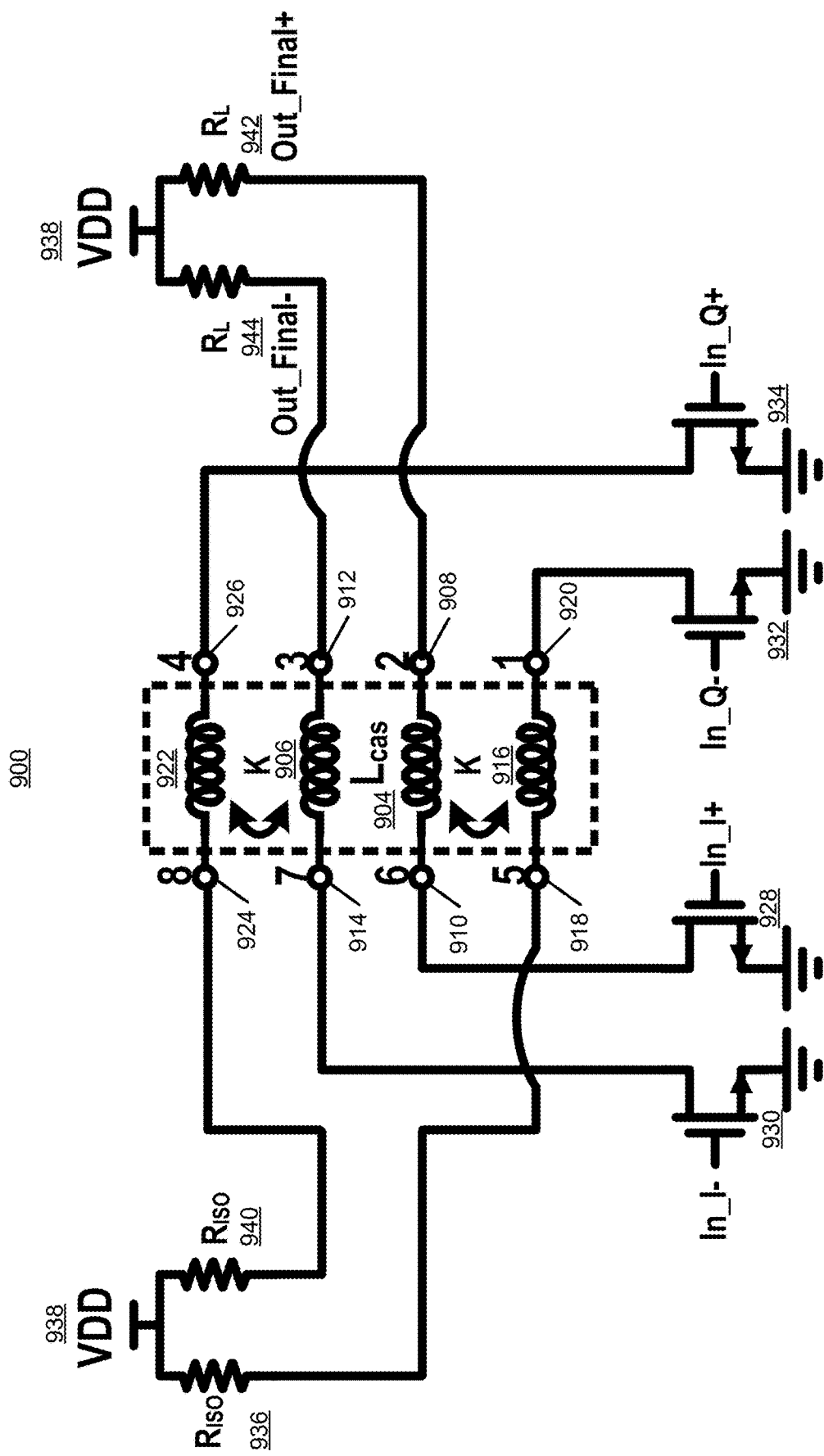
FIG. 9 is a block diagram illustrating a transformer-based IQ combiner circuit with an integrated amplifier circuit according to one embodiment.

FIG. 9 illustrates a transformer-based in-phase and quadrature (IQ) combiner circuit 900 with an integrated amplifier. In one embodiment, the combiner circuit 900 can include a differential balun having a first inductor 904 and a second inductor 906. The first inductor 904 can have a first input terminal 908 and a first output terminal 910. The second inductor 906 can have a second input terminal 912 and a second output terminal 914. Additionally, the combiner circuit 900 can include a third inductor 916 magnetically coupled with the first inductor 904. The third inductor 916 can have a first isolation terminal 918 and a third input terminal 920. The combiner circuit 900 can also include a fourth inductor 922 magnetically coupled with the second inductor 906. The fourth inductor 922 can have a second isolation terminal 924 and a fourth input terminal 926.

In addition, the combiner circuit 900 can include a first transistor 928 coupled to the first input terminal 910 of the first inductor 904. Further, the combiner circuit 900 can also include a second transistor 930 coupled to the second input terminal 914 of the second inductor 906. The first transistor 928, the second transistor 930, the first inductor 904, and the second inductor 906 can form part of an in-phase differential amplifier.

In one embodiment, the combiner circuit 900 can include a third transistor 932 coupled to the third input terminal 920 of the third inductor 916. The combiner circuit 900 can also include a fourth transistor 934 coupled to the fourth input terminal 926 of the fourth inductor 922. The third transistor 932, the fourth transistor 934, the third inductor 916, and the fourth inductor 922 can form a part of a quadrature-phase differential amplifier.

In one embodiment, the third input terminal 920 may represent a negative quadrature-phase (Q−) input terminal and the fourth input terminal 926 may represent a positive quadrature (Q+) input terminal to receive a quadrature-phase differential signal from the quadrature-phase differential amplifier.

In one embodiment, the first input terminal 910 may represent a positive in-phase (I+) input terminal and the second input terminal 914 may represent a negative in-phase (I−) input terminal to receive an in-phase differential signal from the in-phase differential amplifier. In one embodiment, the first output terminal 908 and the second output terminal 912 may represent a differential output of the IQ combiner circuit.

In one embodiment, the combiner circuit 900 can include a first resistor 936 coupled between the first isolation terminal 918 of the third inductor 916 and a voltage source 938. Additionally, the combiner circuit 900 can include a second resistor 940 coupled to the second isolation terminal 924 of the fourth inductor 922 and the voltage source 938.

In one embodiment, the combiner circuit 900 can include a third resistor 942 coupled between the first output terminal 908 of the first inductor 904 and a voltage source 938. In addition, the combiner circuit 900 can include a fourth resistor 944 coupled to the second output terminal 912 of the second inductor 906 and the voltage source 938. Again, the transistors can be FETs.

Figure 10:
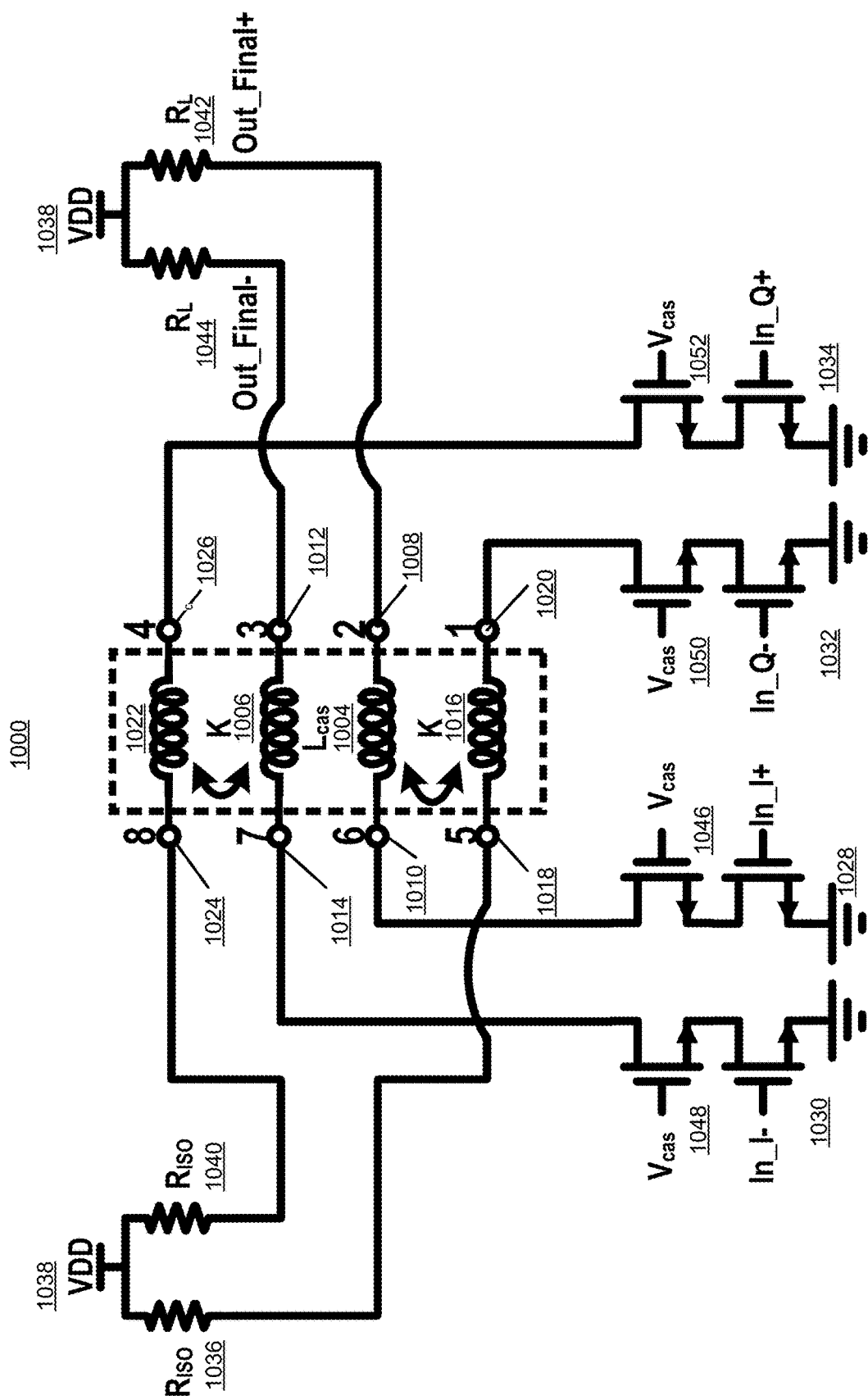
FIG. 10 is a block diagram illustrating a cascode transformer-based IQ combiner circuit with an integrated amplifier circuit according to one embodiment.

FIG. 10 illustrates a cascode transformer-based IQ combiner circuit 1000 with an integrated amplifier circuit according to some embodiments of the disclosure. In one embodiment, the combiner circuit 1000 can include a fifth transistor 1046 coupled between the first transistor 1028 and the first input terminal 1010 of the first inductor 1004. The combiner circuit 1000 can also include a sixth transistor 1048 coupled between the second transistor 1030 and the second input terminal 1014 of the second inductor 1006. The first transistor 1028, the second transistor 1030, the fifth transistor 1046, the sixth transistor 1048, the first inductor 1004, and the second inductor 1006 can form a part of an in-phase differential cascode amplifier.

In one embodiment, the combiner circuit 1000 can include a seventh transistor 1050 coupled between the third transistor 1032 and the third input terminal 1020 of the third inductor 1016. The combiner circuit 1000 can additionally include an eighth transistor 1052 coupled between the fourth transistor 1034 and the fourth input terminal 1026 of the fourth inductor 1022. The third transistor 1032, the fourth transistor 1034, the seventh transistor 1050, the eighth transistor 1052, the third inductor 1016, and the fourth inductor 1022 can form a part of a quadrature-phase differential cascode amplifier.

In one embodiment, the first output terminal 1008 can be configured to output a Final+ signal of the differential output of the IQ combiner circuit 1000. Additionally, the second output terminal 1012 can be configured to output a Final− signal of the differential output of the IQ combiner circuit 1000.

As further illustrated in FIG. 9, all of inductive loads Lcas at differential IQ amplifier can be coupled as a differential IQ transformer. This configuration can reduce multi-inductors or transformers' bulky design as previously discussed. To provide load impedance for the differential IQ amplifier, the terminals 908, 912, 918, and 924 may be loaded with resistors including RL to provide the differential IQ amplifier desired output impedance at Out_I+, Out_I−, Out_Q+, and Out_Q− as shown in FIG. 8A-8B. The differential IQ amplifier can combine the inductive load to enhance current gain and further reuse the current with a transformer-based differential IQ combiner to achieve image rejection at final outputs (e.g., 912 and 908). Moreover, to provide correct VDD biasing, the output load RL on the terminals 908, 912, 918, and 924 may be connected to a voltage source 938.

As shown in FIG. 9, note that RISO may be connected to a VDD 938. In contrast, RISO is connected to ground GND as illustrated in FIGS. 8A-8B. Again, this is because the GND or VDD DC-biasing for the RF signal is served as RF-short. Therefore, the proposed architecture reuses the differential IQ current in the amplifiers and co-designs with the differential IQ combiner with an ultra-compact area to achieve low-cost image rejection. This also removes the need of a capacitor at differential IQ amplifier outputs as shown in FIG. 8A. This capacitor can be lossy at RF frequency. Furthermore, the structure can be easily extended to cascode differential IQ amplifier for large output swing enhancement in FIG. 10 with a huge area saving and bandwidth extension. The structure can be adaptable and scalable in the case (b): serving as differential IQ signal inputs and combined with differential IQ amplifiers for differential signal outputs to finish image rejection, i.e., in building blocks cases: RX1_2, RX2_2, and TX1_1.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A transformer-based in-phase and quadrature (IQ) combiner circuit with an integrated amplifier, the IQ combiner circuit comprising:
a differential balun comprising a first inductor and a second inductor, the first inductor having a first input terminal and a first output terminal, the second inductor having a second input terminal and a second output terminal;
a third inductor magnetically coupled with the first inductor, the third inductor having a first isolation terminal and a third input terminal;
a fourth inductor magnetically coupled with the second inductor, the fourth inductor having a second isolation terminal and a fourth input terminal, wherein the third input terminal represents a negative quadrature-phase (Q−) input terminal and the fourth input terminal represents a positive quadrature (Q+) input terminal to receive a quadrature-phase differential signal from a quadrature-phase differential amplifier;
a first transistor coupled to the first input terminal of the first inductor; and
a second transistor coupled to the second input terminal of the second inductor, wherein the first transistor, the second transistor, the first inductor, and the second inductor form a part of an in-phase differential amplifier.

2. The IQ combiner circuit of claim 1, further comprising:
a third transistor coupled to the third input terminal of the third inductor; and
a fourth transistor coupled to the fourth input terminal of the fourth inductor, wherein the third transistor, the fourth transistor, the third inductor, and the fourth inductor form the part of the quadrature-phase differential amplifier.

3. The IQ combiner circuit of claim 1, wherein the first input terminal represents a positive in-phase (I+) input terminal and the second input terminal represents a negative in-phase (I−) input terminal to receive an in-phase differential signal from the in-phase differential amplifier.

4. The IQ combiner circuit of claim 1, wherein the first output terminal and the second output terminal represent a differential output of the IQ combiner circuit.

5. The IQ combiner circuit of claim 1, further comprising:
a first resistor coupled between the first isolation terminal of the third inductor and a voltage source; and
a second resistor coupled to the second isolation terminal of the fourth inductor and the voltage source.

6. The IQ combiner circuit of claim 1, further comprising:
a third resistor coupled between the first output terminal of the first inductor and a voltage source; and
a fourth resistor coupled to the second output terminal of the second inductor and the voltage source.

7. The IQ combiner circuit of claim 1, further comprising:
a fifth transistor coupled between the first transistor and the first input terminal of the first inductor; and
a sixth transistor coupled between the second transistor and the second input terminal of the second inductor, wherein the first transistor, the second transistor, the fifth transistor, the sixth transistor, the first inductor, and the second inductor form a part of an in-phase differential cascode amplifier.

8. The IQ combiner circuit of claim 2, further comprising:
a seventh transistor coupled between the third transistor and the third input terminal of the third inductor; and
an eighth transistor coupled between the fourth transistor and the fourth input terminal of the fourth inductor, wherein the third transistor, the fourth transistor, the seventh transistor, the eighth transistor, the third inductor, and the fourth inductor form a part of a quadrature-phase differential cascode amplifier.

9. The IQ combiner circuit of claim 4, wherein the first output terminal is configured to output a Final+ signal of the differential output of the IQ combiner circuit, and wherein the second output terminal is configured to output a Final− signal of the differential output of the IQ combiner circuit.

10. A transformer-based in-phase and quadrature (IQ) combiner circuit with an integrated amplifier, the IQ combiner circuit comprising:
a differential balun comprising a first inductor and a second inductor, the first inductor having a first input terminal and a first output terminal, the second inductor having a second input terminal and a second output terminal;
a third inductor magnetically coupled with the first inductor, the third inductor having a first isolation terminal and a third input terminal;

a fourth inductor magnetically coupled with the second inductor, the fourth inductor having a second isolation terminal and a fourth input terminal;

a first transistor coupled to the first input terminal of the first inductor;

a second transistor coupled to the second input terminal of the second inductor, wherein the first transistor, the second transistor, the first inductor, and the second inductor form a part of an in-phase differential amplifier;

a third transistor coupled to the third input terminal of the third inductor; and a fourth transistor coupled to the fourth input terminal of the fourth inductor, wherein the third transistor, the fourth transistor, the third inductor, and the fourth inductor form a part of a quadrature-phase differential amplifier.

11. A transformer-based in-phase and quadrature (IQ) combiner circuit with an integrated amplifier, the IQ combiner circuit comprising:

a differential balun comprising a first inductor and a second inductor, the first inductor having a first input terminal and a first output terminal, the second inductor having a second input terminal and a second output terminal;

a third inductor magnetically coupled with the first inductor, the third inductor having a first isolation terminal and a third input terminal;

a fourth inductor magnetically coupled with the second inductor, the fourth inductor having a second isolation terminal and a fourth input terminal;

a first transistor coupled to the first input terminal of the first inductor;

a second transistor coupled to the second input terminal of the second inductor, wherein the first transistor, the second transistor, the first inductor, and the second inductor form a part of an in-phase differential amplifier;

a first resistor coupled between the first isolation terminal of the third inductor and a voltage source; and a second resistor coupled to the second isolation terminal of the fourth inductor and the voltage source.

12. A transformer-based in-phase and quadrature (IQ) combiner circuit with an integrated amplifier, the IQ combiner circuit comprising:

a differential balun comprising a first inductor and a second inductor, the first inductor having a first input terminal and a first output terminal, the second inductor having a second input terminal and a second output terminal;

a third inductor magnetically coupled with the first inductor, the third inductor having a first isolation terminal and a third input terminal;

a fourth inductor magnetically coupled with the second inductor, the fourth inductor having a second isolation terminal and a fourth input terminal;

a first transistor coupled to the first input terminal of the first inductor;

a second transistor coupled to the second input terminal of the second inductor, wherein the first transistor, the second transistor, the first inductor, and the second inductor form a part of an in-phase differential amplifier;

a third resistor coupled between the first output terminal of the first inductor and a voltage source; and a fourth resistor coupled to the second output terminal of the second inductor and the voltage source.

* * * * *